United States Patent [19]
Miyazato et al.

[11] Patent Number: 4,900,614
[45] Date of Patent: Feb. 13, 1990

[54] GLASS FIBER BASE MATERIAL FOR PRINT WIRING SUBSTRATE

[75] Inventors: Keita Miyazato; Kouichi Yamaki, both of Fukushima, Japan

[73] Assignee: Nitto Boseki Co., Ltd., Fukushima, Japan

[21] Appl. No.: 232,779

[22] Filed: Aug. 16, 1988

[30] Foreign Application Priority Data

Aug. 24, 1987 [JP] Japan ................... 62-208187

[51] Int. Cl.$^4$ .............................. B32B 7/00
[52] U.S. Cl. ..................... 428/251; 428/266; 428/268; 428/273; 428/285; 428/289; 428/901

[58] Field of Search ............... 428/251, 273, 285, 289, 428/901, 266, 268

Primary Examiner—James J. Bell
Attorney, Agent, or Firm—Sixbey, Friedman, Leedom & Ferguson

[57] ABSTRACT

A glass fiber base material for print wiring substrate is disclosed, comprising a fluorescent whitening agent attached to the surface of a sheet made of glass fibers such as woven fabrics, non-woven fabrics and paper. The glass fiber base material has excellent ultraviolet light-shielding properties and, hence, is very useful in production of super LSI.

6 Claims, No Drawings

GLASS FIBER BASE MATERIAL FOR PRINT WIRING SUBSTRATE

FIELD OF THE INVENTION

The present invention relates to a glass fiber sheet-like base material for use in production of glass fiber-reinforced laminated plates for print wiring substrate. More particularly, the present invention is intended to provide a glass fiber base material in which a fluorescent whitening agent is attached to the surface of a constituent glass fiber.

BACKGROUND OF THE INVENTION

As a substrate for print wiring/ laminated plates produced by impregnating a fiber sheet (e.g., woven fabrics, non-woven fabrics or paper of glass fiber) as a reinforcing material with a thermosetting synthetic resin (e.g., epoxy resins or polyimide resins) to produce a prepreg, laminating a plurality of prepregs as produced above, placing a metal foil on each of the both surfaces of the laminate, and then hot pressing the assembly are widely use.

A circuit wiring is formed on the metal foil on each of the both surfaces of the substrate by the photoresist method, and a solder resist cured pattern is further provided thereon by the photoresist method to produce a print wiring plate.

As the solder resist, ultraviolet light-curable resists (e.g., acrylic compound-modified epoxy resins having excellent physical properties) are used. In order to obtain a resist cured pattern by irradiating the both surfaces with an ultraviolet light at the same time, it is required that the above-described glass fiber-reinforced synthetic resin substrate itself does not transmit therethrough an ultraviolet light. In order to obtain a glass fiber-reinforced laminated plate which shields an ultraviolet light, a method in which an organic ultraviolet light absorber is compounded into an impregnating resin varnish in the production of prepregs for glass fiber sheet (cf. JP-A-62-37822) and a method in which fine particles of titanium oxide are attached to a glass fiber sheet (cf. JP-A-62-28241) have been proposed. The term "JP-A" as used herein means an "unexamined published Japanese patent application".

In the method for obtaining ultraviolet light-shielding substrates, means for compounding an ultraviolet light absorber into a resin varnish for production of prepregs involves problems that satisfactory ultraviolet light-shielding properties are difficult to obtain even if a relatively large amount of the ultraviolet light absorber is compounded, curing properties of the varnish are readily reduced, and that the substrate is colored yellow. The method in which fine particles of titanium oxide are attached to the glass fiber sheet directly or after adding to a silane coupling emulsion involves problems that uniform dispersion stability of fine particles of titanium oxide is difficult to maintain and that since attachment of fine particles of titanium oxide often becomes uneven, it is necessary to attach the fine particles of titanium oxide in an amount more than the necessary amount for imparting the ultraviolet light-shielding properties, leading to whitening of the substrate.

SUMMARY OF THE INVENTION

The present invention is intended to overcome the above-described problems of the conventional means by attaching a fluorescent whitening agent to a glass fiber base material for print wiring substrate and provide a substrate having good ultraviolet light-shielding properties.

That is, an object of present invention is to provide a glass fiber base material for print wiring substrate, comprising a fluorescent whitening agent attached to the surface of a glass fiber sheet, e.g., woven fabrics, non-woven fabrics or paper.

DETAILED DESCRIPTION OF THE INVENTION

As the fluorescent whitening agent, various compounds are commercially available as an agent for treating fibers or plastics to exhibit a whitening effect by shielding an energy of ultraviolet light of from 340 to 400 nm and emitting a purplish blue light of from 400 to 500 nm.

For example, bis(triazinylamino)stilbenedisulfonic acid-, coumarin-, pyrazoline-, naphthalamide-, bisbenzoxazolyl-, and bisstyrylbiphenyl-based whitening agents are generally used in the form of an aqueous solution or aqueous emulsion, and these materials can be utilized in the present invention.

The glass fiber sheet is usually subjected to desizing, dipping in a solution of the fluorescent whitening agent, squeezing, drying, and then processing with a surface treating agent to produce a substrate for production of a print wiring substrate.

As the surface treating agent, known coupling agents such as vinyltriethoxy silane and epoxy silane are chosen depending on the type of the resin for prepregs and usually used in such an amount that the amount attached is from 0.05 to 0.2%.

Though it is most preferred that the treatment with the solution of fluorescent whitening agent is achieved before processing with the surface treating agent, it may be carried out after processing with the surface treating agent, or it may be carried out by adding the fluorescent whitening agent to the solution of surface treating agent. Adding the fluorescent whitening agent to the resin varnish for prepregs, however, is unsuitable because it is readily dissolved in a dissolving developing solution at the time of forming a wiring circuit by the photoresist method, leading to a reduction in ultraviolet light-shielding properties.

The amount of the fluorescent whitening agent attached to the glass fiber sheet is usually not more than 0.5%. Depending on the number of laminated sheets, a 99% or more ultraviolet light-shielding effect can be obtained. No special effect can be obtained even if the amount is increased to more than 1%.

The glass fiber base material of the present invention has a fluorescent whitening agent uniformly attached to the surface of the constituent glass fiber. Therefore, in the print wiring substrate obtained by laminating a plurality of prepregs produced using this base material, the ultraviolet light projected from one surface is converted into a fluorescent light and almost completely prevented from reaching the other surface.

In the base material to which the fluorescent whitening agent has been attached, coloration is not substantially observed and, therefore, such is suitable when the substrate is translucent or arbitrarily colored.

The present invention is described in greater detail with reference to the following Example as one embodiment of the process of production. In the Example all percents (%) are by weight.

EXAMPLE (1) As the glass fiber sheet base material, a desized glass fiber fabric (produced by Nitto Boseki Co., Ltd., WEA-18w, basis weight: 212 g/cm$^2$) was used.

(2) As the fluorescent whitening agent, an aqueous solution of Illuminarl ® BBS (a stilbene-based fluorescent whitening agent produced by Showa Chemical Co., Ltd.) and an aqueous emulsion of Uvitex ® EBF (a benzoxazolyl-based fluorescent whitening agent produced by Ciba-Geigy AG) were prepared in a concentration of 0.05%, 0.1%, 0.5% and 1.0%, respectively.

(3) Each of the glass fiber sheet base materials as prepared in (1) was dipped in each of the eight types of fluorescent whitening agent solutions as prepared in (2) with a pickup of 30% and then dried upon heating to obtain eight types of products in each of which the fluorescent whitening agent was attached uniformly to the surface of the constituent glass fiber sheet.

(4) Each of the products as prepared in (3) was dipped in a 0.1% aqueous acetic acid solution containing 0.8% of a silane coupling agent (Epoxy Silane ®A-187 produced by Nippon Unicar Co., Ltd.) with a pickup of 30% and then dried upon heating. Furthermore, it was impregnated with an epoxy resin varnish according to the following G-10 formulation to an extent of 70% and preliminarily dried to obtain a prepreg. Three prepregs were laminated and molded by the usual method to obtain eight types of test laminated plates.

Epoxy Resin Varnish

| | |
|---|---|
| Epikote ® 1001 (an epoxy resin produced by Shell Chemical Co., Ltd.) | 100 parts by weight |
| Dicyandiamide | 2 parts by weight |
| Benzyldimethylamine | 0.2 part by weight |
| Methyl oxitol | about 100 parts by weight |

As a comparative example, the glass fiber sheet as prepared in (1) was subjected to the treatment in (4) with the silane coupling agent and then with the epoxy resin varnish to prepare prepregs, three of which prepregs were molded to produce a test laminated plate.

The above-prepared eight types of laminated plates using the glass fiber material of the present invention and the comparative laminated plate were measured for 365 nm-ultraviolet light transmittance (% T) by the use of a B 100A type lamp, a UVX 36 type sensor, and a UVX radio meter, all of which are produced by UVP Co. The results were tabulated below.

| | Fluorescent Whitening Agent | |
|---|---|---|
| Concentration of Solution | Illuminarl ® BBS | Uvitex ® EBF |
| 0.05% | 4.89% T | 4.18% T |
| 0.1% | 2.76 | 2.01 |
| 0.5 | 0.79 | 0.38 |
| 1.0 | 0.48 | 0.19 |
| 0 (Comparative Example) | 27.3 | |

As can be seen from the foregoing results, it is apparent that the laminated plate using the glass fiber base material of the present invention has excellent ultraviolet light-shielding properties, and its color tone is translucent, which is substantially the same as that of the Comparative Example.

In accordance with the present invention, a glass fiber sheet-like base material having excellent ultraviolet light-shielding effects can be easily and economically produced utilizing an ultraviolet light conversion action of a fluorescent whitening agent which has hitherto been used to increase the degree of whiteness. With a laminate substrate produced using the glass fiber sheet-like base material, the formation of cured patterns of the both surfaces of a solder resist at the time of production of a print wiring plate can be efficiently carried out by irradiation the both surfaces with an ultraviolet light at the same time. The invention greatly contributes to an increase in efficiency in production of a print wiring plate for super LSI.

While the invention has been described in detail and with reference to specific embodiments thereof, it will be apparent to one skilled in the art that various changes and modifications can be made therein without departing from the spirit and scope thereof.

What is claimed is:

1. A glass fiber base material suitable for forming a print wiring substrate, wherein said base material comprises a glass fiber sheet which has been impregnated with an aqueous solution of a fluorescent whitening agent and then dried.

2. The glass fiber base material described in claim 1, wherein said glass fiber sheet is selected from the group consisting of glass fiber-containing woven fabrics, glass fiber-containing non-woven fabrics and glass fiber-containing paper.

3. The glass fiber base material described in claim 1, wherein said fluorescent whitening agent-impregnated glass fiber sheet is further processed with a surface treating agent.

4. The glass fiber base material described in claim 3, wherein said surface treating agent is selected from the group consisting of vinyl triethoxy silane and epoxy silane.

5. A glass fiber base material as in claim 1, wherein said fluorescent whitening agent has an effect for shielding an energy of ultraviolet light of from 340 to 400 nm and emitting a purplish blue light of from 400 to 500 nm.

6. A glass fiber base material as in claim 5, wherein said fluorescent whitening agent is selected from bis(-triazinylamino)stilbenedisulfonic acid-, coumarin-, pyrazoline-, naphthalamide-, bisbenzoxazolyl-, and bis-styrylbiphenyl-based whitening agents.

* * * * *